United States Patent
Takahashi et al.

(10) Patent No.: US 9,212,268 B2
(45) Date of Patent: Dec. 15, 2015

(54) BIAXIALLY ORIENTED POLYETHYLENE TEREPHTHALATE FILM AND METHOD FOR PRODUCING SAME

(71) Applicant: TORAY INDUSTRIES, INC., Tokyo (JP)

(72) Inventors: Kenta Takahashi, Otsu (JP); Tetsuya Machida, Otsu (JP); Takuji Higashioji, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 14/396,295

(22) PCT Filed: Jul. 19, 2013

(86) PCT No.: PCT/JP2013/069620
§ 371 (c)(1),
(2) Date: Oct. 22, 2014

(87) PCT Pub. No.: WO2014/030474
PCT Pub. Date: Feb. 27, 2014

(65) Prior Publication Data
US 2015/0119548 A1    Apr. 30, 2015

(30) Foreign Application Priority Data

Aug. 21, 2012    (JP) ................. 2012-182010

(51) Int. Cl.
| | | |
|---|---|---|
| C08G 63/02 | (2006.01) | |
| C08J 5/18 | (2006.01) | |
| B29C 55/12 | (2006.01) | |
| B29C 47/00 | (2006.01) | |
| B29D 7/01 | (2006.01) | |
| H01L 31/0392 | (2006.01) | |
| B29K 67/00 | (2006.01) | |

(52) U.S. Cl.
CPC ............ C08J 5/18 (2013.01); B29C 47/0057 (2013.01); B29C 55/12 (2013.01); B29D 7/01 (2013.01); H01L 31/03926 (2013.01); B29K 2067/003 (2013.01); C08J 2367/02 (2013.01)

(58) Field of Classification Search
CPC ............................. C08G 63/78; C08G 63/183
USPC ............... 428/143, 323, 847.3; 528/176, 190, 528/193, 194, 271, 272
See application file for complete search history.

(56) References Cited

U.S. PATENT DOCUMENTS

| | | | | |
|---|---|---|---|---|
| 5,534,323 | A | * | 7/1996 | Chuujou et al. ............ 428/847.3 |
| 2011/0209747 | A1 | | 9/2011 | Shi |
| 2013/0269775 | A1 | | 10/2013 | Hashimoto et al. |
| 2013/0323487 | A1 | | 12/2013 | Takahashi et al. |

FOREIGN PATENT DOCUMENTS

| | | |
|---|---|---|
| JP | 9-323394 A | 12/1997 |
| JP | 10-138333 A | 5/1998 |
| JP | 2000-309052 A | 11/2000 |
| JP | 2008-30475 A | 2/2008 |
| JP | 2010-270237 A | 12/2010 |
| JP | 2011-178866 A | 9/2011 |
| JP | 2012-136016 A | 7/2012 |
| WO | WO 2012/114988 A1 | 8/2012 |

OTHER PUBLICATIONS

International Search Report for PCT/JP2013/069620 mailed on Oct. 8, 2013.

* cited by examiner

*Primary Examiner* — Terressa Boykin
(74) *Attorney, Agent, or Firm* — Birch Stewart Kolasch & Birch, LLP

(57) ABSTRACT

This film provides a polyethylene terephthalate film whereby dimensional variation in various steps can be reduced, particularly when the film is used as a substrate film for a flexible device, and that is suitable as a substrate film having minimal curl and excellent appropriateness for processing. This biaxially oriented polyethylene terephthalate film has a degree of crystallinity (Xc) of 0.35 to 0.50, the intrinsic viscosity (IV) of the resin constituting the film is 0.66-1.0 dl/g, the coefficient of thermal expansion at a temperature of 50-170° C. in each of the machine direction and transverse direction of the film is 0.29 ppm/° C., and the degree of thermal shrinkage at 180° C. in each of the machine direction and transverse direction of the film is 0.5%-1.0%.

20 Claims, No Drawings

BIAXIALLY ORIENTED POLYETHYLENE TEREPHTHALATE FILM AND METHOD FOR PRODUCING SAME

TECHNICAL FIELD

The present invention relates to biaxially oriented polyethylene terephthalate film that is high in thermal dimensional stability particularly at high temperatures. The biaxially oriented polyethylene terephthalate film according to the present invention can be used effectively as base film for flexible devices. Among others, the biaxially oriented polyethylene terephthalate film according to the present invention can serve as base film that suffers little dimensional changes and little curling and shows high processing suitability when used in various production steps particularly for manufacturing products such as organic electroluminescence (hereinafter occasionally abbreviated as EL) display, electronic paper, organic EL lighting, organic solar battery, dye-sensitized solar battery, and barrier film.

BACKGROUND ART

In recent years, attention is focused on various flexible electronic devices which are required to be lightweight, thin, or flexible in shape. Plastic film is currently used instead of glass, which was used conventionally, as base material of flexible electronic devices, but such plastic film used as base material of electronic devices has serious disadvantages such as deterioration in thermal dimensional stability and curling properties that can result from thermal expansion and thermal shrinkage during steps for forming transparent electrically conductive layers or luminescent/power generating layers.

Having good heat characteristics, dimensional stability, mechanical characteristics, electric characteristics, heat resistance, and surface characteristics, biaxially oriented polyethylene terephthalate film has been in wide use as base material for various products including magnetic recording material, packaging material, electric insulation material, various photographic materials, graphic art material, and optical display material. It is thought, however, that base films for flexible devices with improved physical properties have to be developed, and efforts made in the past to provide polyethylene terephthalate film with high characteristics have disclosed a method that blends thermoplastic resin with polyethylene terephthalate (Patent document 1), a method that adds a large quantity of particles to improve the low thermal expansion property (Patent document 2), a method that blends thermoplastic resin with polyethylene terephthalate resin to form a sea-island structure, thereby improving thermal dimensional stability (Patent document 3), and a method that adds an inorganic filler to polyester resin to improve thermal dimensional stability (Patent document 4).

PRIOR ART DOCUMENTS

Patent Documents

Patent document 1: Japanese Unexamined Patent Publication (Kokai) No. 2003-101166
Patent document 2: Japanese Unexamined Patent Publication (Kokai) No. 2004-35720
Patent document 3: Japanese Unexamined Patent Publication (Kokai) No. 2011-184617
Patent document 4: Japanese Unexamined Patent Publication (Kokai) No. 2012-15411

SUMMARY OF THE INVENTION

Problems to be Solved by the Invention

However, the method described in Patent document 1 that blends thermoplastic resin cannot allow the polyethylene terephthalate to have sufficiently improved low thermal expansion property because it is difficult to achieve a high degree of orientation. The method disclosed in Patent document 2 cannot improve the low thermal expansion property sufficiently because the addition of particles to a high concentration causes deterioration in stretching properties. The addition of particles to a high concentration also causes deterioration in transparency. In Patent document 3, furthermore, thermal dimensional stability is improved by orienting the molecules to a high degree with the sea-island structures acting as nodal points, but it is difficult to improve the thermal dimensional stability of polyethylene terephthalate based polymers that do not have a sea-island structure. In Patent document 4, carbon nanofiber is added as an inorganic filler, but this causes deterioration in stretching properties and fails to improve the low thermal expansion property sufficiently. Furthermore, the addition of an inorganic filler causes deterioration in transparency and color.

Thermal expansion and thermal shrinkage are in a trade-off, relationship, making it difficult for the conventional methods to achieve improved low thermal expansion property and a low thermal shrinkage simultaneously in addition to maintaining transparency.

An object of the present invention is to solve the aforementioned problem and obtain biaxially oriented polyethylene terephthalate film with high thermal dimensional stability (low thermal expansion property) particularly at high temperatures, along with high transparency, and in particular, to provide biaxially oriented polyethylene terephthalate film that can serve as base film for flexible devices that suffers from little dimensional changes and little curling and shows high processing suitability in various manufacturing steps.

Means of Solving the Problems

The present invention aims to meet the aforementioned object and has the following features:
(1) Biaxially oriented polyethylene terephthalate film comprising at least polyethylene terephthalate resin and having a degree of crystallinity (Xc) of more than 0.35 and 0.50 or less, the resin that constitutes the film having an intrinsic viscosity (IV) of 0.66 to 1.0 dl/g, and the film having a coefficient of thermal expansion of 0 to 29 ppm/° C. in a temperature range of 50° C. to 170° C. in both the film's machine direction and transverse direction and a degree of thermal shrinkage at 180° C. of −0.5% to 1.0% in both the film's machine direction and transverse direction.
(2) Biaxially oriented polyethylene terephthalate film as described in paragraph (1), wherein the intrinsic viscosity (IV) of the resin that constitutes the film is 0.68 to 1.0 dl/g.
(3) Biaxially oriented polyethylene terephthalate film as described in either paragraph (1) or (2), wherein both the coefficient of thermal expansion in the machine direction of the film and that in its transverse direction are 0 to 25 ppm/° C. in the temperature range of 50° C. to 170° C.
(4) Biaxially oriented polyethylene terephthalate film as described in any one of paragraphs (1) to (3), wherein a minor melting peak temperature (T-meta) occurs in the range of 210° C. to 240° C.

(5) Biaxially oriented polyethylene terephthalate film as described in any one of paragraphs (1) to (4), wherein the film haze is 0% to 3%.
(6) Biaxially oriented polyethylene terephthalate film as described in any one of paragraphs (1) to (5), wherein the percent change in the film haze is 0.0% to 3.0% when the film is heat-treated at 180° C. for 30 minutes.
(7) Biaxially oriented polyethylene terephthalate film as described in any one of paragraphs (1) to (6) that is produced by:
melt-extruding polyethylene terephthalate resin while cooling for solidification to provide unstretched film,
biaxially stretching the unstretched film and heat-setting it in two or more stages differing in temperature, the heat set temperature at the anterior heat set stages, Ths1 (° C.), being 150° C. to 200° C., and the heat set temperature at the final stage, Ths2 (° C.), being 210° C. to 240° C.,
cooling it at a temperature of 35° C. or lower after the heat set, and
subjecting it to relaxation annealing treatment at a temperature of higher than 200° C. and 235° C. or lower.
(8) The present invention also provides a production method for biaxially oriented polyethylene terephthalate film as described in any one of paragraphs (1) to (4) comprising the steps of:
melt-extruding polyethylene terephthalate resin while cooling for solidification to provide unstretched film,
biaxially stretching the unstretched film and heat-setting it in two or more stages differing in temperature, the heat set temperature at the anterior heat set stages, Ths1 (° C.), being 150° C. to 200° C., and the heat set temperature at the final stage, Ths2 (° C.), being 210° C. to 240° C.,
cooling it at a temperature of 35° C. or lower after the heat set, and
subjecting it to relaxation annealing treatment at a temperature of higher than 200° C. and 235° C. or lower.
(9) Film for organic EL substrates comprising biaxially oriented polyethylene terephthalate film as described in any one of paragraphs (1) to (7).
(10) Film for flexible solar battery substrates comprising biaxially oriented polyethylene terephthalate film as described in any one of paragraphs (1) to (7).
(11) Film for barrier substrates comprising biaxially oriented polyethylene terephthalate film as described in any one of paragraphs (1) to (7).

Advantageous Effect of the Invention

The present invention makes it possible to obtain polyethylene terephthalate film that is high in thermal dimensional stability at high temperatures. It provides highly planar polyethylene terephthalate film that can serve as base film for flexible devices that suffer little dimensional change in various manufacturing steps, particularly little curling during annealing.

DESCRIPTION OF PREFERRED EMBODIMENTS

It is necessary for the biaxially oriented polyethylene terephthalate film according to the present invention to contain, as primary component, polyethylene terephthalate (hereinafter, occasionally referred to as PET), which is a crystalline polyester, particularly from the viewpoint of its capability to form film with high productivity, mechanical characteristics, thermal dimensional stability, electric characteristics, surface characteristics, and heat resistance. Here, the primary component is a component that accounts for 80 mass % or more of the film.

In the biaxially oriented PET film according to the present invention, it is necessary for the resin that constitutes the film to have an intrinsic viscosity (IV) of 0.66 to 1.0 dl/g, preferably 0.68 to 1.00 dl/g. If the resin that constitutes the film has an intrinsic viscosity (IV) in the above range, the coefficient of thermal expansion of the film can be reduced effectively by orienting the film to a high degree and the precipitation of oligomers is depressed. If IV is less than 0.66 dl/g, low molecular weight components will account for a large part, possibly accelerating the precipitation of oligomers during heating. Furthermore, the molecular chains will be shorter and low thermal expansion property will not be achieved effectively in some cases even if they are highly oriented. If IV is less than 0.68 dl/g, the molecular chains will be shorter and low thermal expansion property will not be achieved effectively even if they are highly oriented. If the intrinsic viscosity is more than 1.00 dl/g, on the other hand, low thermal expansion property can be achieved, but large thermal shrinkage will occur in a high temperature range. In a molten state, furthermore, the resin will be so high in viscosity that a large load will be applied to the extruder during film production to make stable discharge difficult, and uneven thickness distribution and uneven stretching can occur, possibly leading to a decrease in productivity. The intrinsic viscosity of the resin that constitutes the film is influenced particularly by the intrinsic viscosities of the component materials as well as water contents of the component materials and temperature conditions during film production. The intrinsic viscosity of the resin that constitutes the film increases with the intrinsic viscosity of the polyethylene terephthalate resin used as an input material. The intrinsic viscosity of the resin that constitutes the film may be adjusted appropriately by laminating or kneading several polyethylene terephthalate resins with different intrinsic viscosities used as input materials. The intrinsic viscosity of the resin that constitutes the film is preferably 0.70 to 0.90 dl/g, more preferably 0.70 to 0.80 dl/g.

It is necessary for the biaxially oriented PET film according to the present invention to have a degree of crystallinity (Xc) of more than 0.35 and 0.50 or less. If it is in the above range, thermal shrinkage at high temperatures can be reduced as described later. If the degree of crystallinity (Xc) is 0.35 or less, it suggests that crystals may not have formed to a sufficient degree, possibly failing to achieve a sufficiently low thermal shrinkage. If the degree of crystallinity (Xc) is more than 0.50, it suggests that crystals have grown and accordingly, the orientation in in-plane directions may be low, possibly making it impossible to achieve sufficiently low thermal expansion property. In particular, the degree of crystallinity (Xc) is preferably 0.38 to 0.42. The degree of crystallinity (Xc) is largely influenced by heat treatment conditions. For example, the degree of crystallinity can be increased by raising the heat set temperature in the heat treatment step.

When heated from 30° C. to 180° C. and then cooled to 50° C. according to the procedure described later, it is necessary for the biaxially oriented PET film according to the present invention to have a coefficent of thermal expansion of 0 to 29 ppm/° C., more preferably 0 to 25 ppm/° C., in the temperature range of 50° C. to 170° C. in both the film's machine direction and the film's transverse direction. If the coefficent of thermal expansion is larger than the above range, large dimensional changes may be caused by heating, and when used as base film for flexible devices, the film will undergo significant curling in various steps, possibly leading to problems such as peeling from device layers and cracking due to deformation. It is preferable for the coefficient of thermal expansion at temperatures of 50° C. to 170° C. to be 0 to 23 ppm/° C., more preferably 0 to 20 ppm/° C., in both the film's machine direction and the film's transverse direction. The film according to the present invention can have a required coefficient of thermal expansion when produced under such film production conditions as described later, particularly by appropriately controlling the heat treatment conditions.

It is necessary for the biaxially oriented PET film according to the present invention to have a degree of thermal shrinkage at 180° C. of −0.5% to 1.0% in both the film's machine direction and film's transverse direction. If it is in the above range, it is possible to reduce the curling that may be caused by heating in various steps during device layer formation, leading to smaller dimensional changes and allowing the depression of peeling of the film from device layers. It is more preferably −0.5% to 0.7%, still more preferably −0.2% to 0.5%.

The degree of thermal shrinkage at 180° C. in the film's machine direction and the film's transverse direction can be adjusted appropriately by controlling the predetermined film production conditions as described later and it is particularly preferable to control the heat treatment conditions and relaxation annealing conditions. The degree of thermal shrinkage of the film according to the present invention increases with an increasing degree of thermal shrinkage of the film before the annealing step. To ensure a degree of thermal shrinkage of less than 1.0%, it is preferable for the degree of thermal shrinkage at 180° C. before the annealing step to be in the range of 0% to 4.0%. If the degree of thermal shrinkage at 180° C. before the annealing step is more than 4.0%, the degree of thermal shrinkage is so large that the relaxation annealing step may not serve to lower the degree of thermal shrinkage to a level required for the present application. Furthermore, the thermal dimensional stability at high temperatures may not be sufficiently high and large shrinkage may occur in the relaxation annealing step, possibly leading to creasing, undulation, and curling to cause a decrease in planarity. The degree of thermal shrinkage at 180° C. before the annealing step is more preferably 0% to 3.0%. The degree of thermal shrinkage before the annealing step is influenced by the draw ratio and heat treatment conditions and the degree of thermal shrinkage before the relaxation annealing step can be decreased by carrying out multi-stage heat set in the heat treatment step as described later. Accordingly, this allows the biaxially oriented PET film according to the present invention to have a degree of thermal shrinkage at 180° C. of −0.5% to 1.0% in both the film's machine direction and the film's transverse direction, making it possible to maintain required planarity in the relaxation annealing step.

It is preferable for the biaxially oriented PET film according to the present invention to have a film haze of 0% to 3%. If the film haze is more than 3%, the transparency may be low, possibly leading to organic EL devices and thin film solar batteries with inferior performance. The film haze is more preferably 0% to 2%. If the crystallinity index, which is defined later, of the PET material to be used is increased, its film haze may increase in some cases. The film haze can also be controlled by varying the content of particles added and the average of their particle diameters. An average particle diameter of 1 nm to 3,000 nm is preferable from the viewpoint of the film's transparency because this allows the film haze to be maintained in the above range easily. It is more preferably 1 nm to 2,000 nm, still more preferably 1 nm to 1,500 nm. The content of particles is preferably 0.0 part by mass to 1.0 part by mass. If it is in the above range, it is possible to use a mixture of particles of different materials.

It is preferable for the biaxially oriented PET film according to the present invention to have a minor melting peak temperature (T-meta) at 210° C. to 240° C. T-meta is influenced by the temperature of heat treatment carried out for crystal structure fixation after biaxial stretching, but if T-meta is less than 210° C., structure fixation may not be achieved to a sufficient degree by the heat treatment, possibly leading to a large thermal shrinkage. If T-meta is more than 240° C., orientation will be relaxed extremely and the coefficient of thermal expansion tends to increase easily. T-meta is more preferably 215° C. to 235° C., still more preferably 220° C. to 230° C. T-meta can be controlled by varying the heat set temperature. T-meta changes according to the type of film production machine and the film production speed and increases with an increasing heat set temperature.

For the biaxially oriented PET film according to the present invention, the change in film haze caused by heat treatment at 180° C. for 30 minutes is preferably 0.0% to 3.0%. A change in film haze in the above range is preferable because it ensures a required transparency maintained during the device layer formation process. A change in film haze of more than 3.0% will cause a decrease in transparency in the device layer formation process, leading to a decrease in power generation efficiency and luminescence efficiency. The change in film haze is more preferably 0% to 1.5%. If PET film is heat-treated at high temperatures, low molecular weight components will precipitate as oligomers, leading to an increased film haze. Accordingly, if the film's intrinsic viscosity is increased, the contents of low molecular weight components will decrease, leading to a reduction in the change in film haze. For the biaxially oriented PET film according to the present invention, it is preferable that PET resin deprived of oligomer components be used as input material. Such oligomer-free PET resin can be produced by a technique as described in Japanese Unexamined Patent Publication (Kokai) No. 2005-53968.

It is preferable for the biaxially oriented PET film according to the present invention to have a crystallinity index ($\Delta$Tcg) of 10° C. or more and 60° C. or less. If $\Delta$Tcg is in the above range, crystallite formation is promoted in the PET film to improve the thermal dimensional stability at high temperatures. For the present invention, in particular, $\Delta$Tcg in the above range is preferable because in that case, crystallites are formed easily in the heat set stages of the heat treatment step described later. If it is less than 10° C., the crystallinity will be too high and stretching properties will deteriorate, possibly leading to difficulty in film production. $\Delta$Tcg is more preferably 30° C. to 50° C. As a method to maintain $\Delta$Tcg in the above range, it is preferable to add at least one or more crystal nucleating agents to PET and use a PET material having a crystallization rate increased by the effect of crystal nucleating agents. Effective methods include, for instance, ester interchange and the existence of lithium acetate, magnesium acetate, potassium acetate, phosphorous acid, acid, phosphonic acid, derivatives of these acids, antimony oxide, or germanium oxide during polymerization. Particularly preferable is the combination of magnesium acetate, phosphonic acid (or a derivative thereof), and antimony oxide, and useful phosphonic acids (or derivatives thereof) include phenylphosphonic acid and dimethyl phenylphosphonate.

It is also effective to add a crystalline substance to PET to improve the crystallization rate. In particular, preferable crystalline substances include talc, aliphatic carboxylic amides, aliphatic carboxylates, aliphatic alcohols, aliphatic carboxylic esters, sorbitol based compounds, and organic phosphoric acid based compound. For the present invention, in particular, it is particularly desirable for the crystal nucleating agent to be one crystal nucleating agent selected from the group consisting of aliphatic carboxylic amides, aliphatic carboxylates, and sorbitol based compounds. Here, the preferable content of the crystal nucleating agent is such that the crystal nucleating agent accounts for 0.1 parts by mass or more and 2 parts by mass or less per 100 parts by mass of the PET. If the content of the crystal nucleating agent is less than 0.1 part by mass, desired effect may not be developed sufficiently in some cases, whereas if the content of the crystal nucleating agent is more than 2 parts by mass, the transparency may deteriorate in some cases, which is not preferable.

Here, useful aliphatic carboxylic amides include aliphatic monocarboxylic amides such as lauric amide, palmitic amide, oleic amide, stearic amide, erucic amide, behenic amide, ricinoleic amide, and hydroxystearic amide; N-substituted aliphatic monocarboxylic amides such as N-oleyl palmitic amide, N-oleyl oleic amide, N-oleyl stearic amide, N-stearyl oleic amide, N-stearyl stearic amide, N-stearyl erucic amide, methylol stearic amide, and methylol behenic amide; aliphatic biscarboxylic amides such as methylene-bis-stearic amide, ethylene bislauric amide, ethylene biscapric amide, ethylene bisoleic amide, ethylene bisstearic amide, ethylene biserucic amide, ethylene bisbehenic amide, ethylene bisisostearic amide, ethylene bishydroxystearic amide, butylene bisstearic amide, hexamethylene bisoleic amide, hexamethylene-bis-stearic amide, hexamethylene bisbehenic amide, hexamethylene bishydroxystearic amide, m-xylylene bisstearic amide, and m-xylylene bis-12-hydroxystearic amide; N-substituted aliphatic carboxylic bisamides such as N,N'-dioleyl sebacic amide, N,N'-dioleyl adipic amide, N,N'-distearyl adipic amide, N,N'-distearyl sebacic amide, N,N'-distearyl isophthalic amide, and N,N'-distearyl terephthalic amide; and N-substituted ureas such as N-butyl-N'-stearyl urea, N-propyl-N'-stearyl urea, N-stearyl-N'-stearyl urea, N-phenyl-N'-stearyl urea, xylylene bisstearyl urea, tolylene bisstearyl urea, hexamethylene bisstearyl urea, diphenyl methane bisstearyl urea, and diphenyl methane bislauryl urea. These may be used singly or as a mixture of two or more thereof. Of these, preferable ones include aliphatic monocarboxylic amides, N-substituted aliphatic monocarboxylic amides, and aliphatic biscarboxylic amides, of which particularly preferable are palmitic amide, stearic amide, erucic amide, behenic amide, ricinoleic amide, hydroxystearic amide, N-oleyl palmitic amide, N-stearyl erucic amide, ethylene biscapric amide, ethylene bisoleic amide, ethylene bislauric amide, ethylene biserucic amide, m-xylylene bisstearic amide, and m-xylylene bis-12-hydroxystearic amide.

Specific examples of useful aliphatic carboxylates include acetates such as sodium acetate, potassium acetate, magnesium acetate, and calcium acetate; laurates such as sodium laurate, potassium laurate, potassium hydrogen laurate, magnesium laurate, calcium laurate, zinc laurate, and silver laurate; myristates such as lithium myristate, sodium myristate, potassium hydrogen myristate, magnesium myristate, calcium myristate, zinc myristate, and silver myristate; palmitates such as lithium palmitate, potassium palmitate, magnesium palmitate, calcium palmitate, zinc palmitate, copper palmitate, lead palmitate, thallium palmitate, and cobalt palmitate; oleates such as sodium oleate, potassium oleate, magnesium oleate, calcium oleate, zinc oleate, lead oleate, thallium oleate, copper oleate, and nickel oleate; stearates such as sodium stearate, lithium stearate, magnesium stearate, calcium stearate, barium stearate, aluminum stearate, thallium stearate, lead stearate, nickel stearate, and beryllium stearate; isostearates such as sodium isostearate, potassium isostearate, magnesium isostearate, calcium isostearate, barium isostearate, aluminum isostearate, zinc isostearate, and nickel isostearate; behenates such as sodium behenate, potassium behenate, magnesium behenate, calcium behenate, barium behenate, aluminum behenate, zinc behenate, and nickel behenate; and montanates such as sodium montanate, potassium montanate, magnesium montanate, calcium montanate, barium montanate, aluminum montanate, zinc montanate, and nickel montanate. These may be used singly or as a mixture of two or more thereof. In particular, preferable ones include stearic acid salts and montanic acid salts, of which particularly preferable are sodium stearate, potassium stearate, zinc stearate, barium stearate, and sodium montanate.

Specific examples of aliphatic alcohols include aliphatic monoalcohols such as pentadecyl alcohol, cetyl alcohol, heptadecyl alcohol, stearyl alcohol, nonadecyl alcohol, eicosyl alcohol, ceryl alcohol, and melissyl alcohol; aliphatic polyhydric alcohols such as 1,6-hexanediol, 1,7-heptanediol, 1,8-octanediol, 1,9-nonanediol, and 1,10-decanediol; and cyclic alcohols such as cyclopentane-1,2-diol, cyclohexane-1,2-diol, and cyclohexane-1,4-diol. These may be used singly or as a mixture of two or more thereof. In particular, preferable ones include aliphatic monoalcohols, of which particularly preferable is stearyl alcohol.

Specific examples of such aliphatic carboxylic esters include aliphatic monocarboxylic esters such as lauric acid cetyl ester, lauric acid phenacyl ester, myristic acid cetyl ester, myristic acid phenacyl ester, palmitic acid isopropylidene ester, palmitic acid dodecyl ester, palmitic acid tetradodecyl ester, palmitic acid pentadecyl ester, palmitic acid octadecyl ester, palmitic acid cetyl ester, palmitic acid phenyl ester, palmitic acid phenacyl ester, stearic acid cetyl ester, and behenic acid ethyl ester; monoesters of ethylene glycol such as glycol monolaurate, glycol monopalmitate, and glycol monostearate; diesters of ethylene glycol such as glycol dilaurate, glycol dipalmitate, and glycol distearate; monoesters of glycerin such as monolauric acid glycerin ester, monomyristic acid glycerin ester, monopalmitic acid glycerin ester, and glyceryl monostearate ester; diesters of glycerin such as dilauric acid glycerin ester, dimyristic acid glycerin ester, dipalmitic acid glycerin ester, and distearic acid glycerin ester; and triesters of glycerin such as trilauric acid glycerin ester, trimyristic acid glycerin ester, tripalmitin acid glycerin ester, tristearate glycerin ester, palmitodiolein, palmitodistearin, and oleodistearin. These may be used singly or as a mixture of two or more thereof.

Specific examples of such aliphatic/aromatic carboxylic acid hydrazides include sebacic acid dibenzoic acid hydrazide; specific examples of melamine based compounds include melamine cyanurate and polyphosphoric acid melamine; and specific examples of metal salts of phenylphosphonic acid include phenylphosphonic acid zinc salt, phenylphosphonic acid calcium salt, phenylphosphonic acid magnesium salt, and phenylphosphonic acid magnesium salt.

Sorbitol based compounds include 1,3-di(p-methylbenzylidene) sorbitol, 2,4-di(p-methylbenzylidene) sorbitol, 1,3-dibenzylidene sorbitol, 2,4-dibenzylidene sorbitol, 1,3-di(p-ethyldibenzylidene) sorbitol, 2,4-di(p-ethyldibenzylidene) sorbitol.

Organic phosphoric acid compounds include sodium bis(4-tert-butylphenyl) phosphate, [Phosphoric acid [2,2'-methylenebis(4,6-di-tert-butylphenyl)]] sodium salt, mixtures of an basic multivalent metal salt of cyclic organic phosphoric ester with one selected from the group consisting of alkali metal carboxylate, alkali metal β-diketonate, organic metal carboxylate of alkali metal β-keto-acetic acid ester salt.

Of those given above, aliphatic carboxylic amides, aliphatic carboxylates, and sorbitol based compounds are preferable from the viewpoint of transparency and heat resistance.

The biaxially oriented PET film according to the present invention preferably has a plane orientation coefficient (fn) in the film of 0.15 or more and 0.185 or less. If it is less than 0.15, the degree of orientation will decrease, possibly failing to achieve sufficiently low thermal expansion property. If it is more than 0.185, an excessively high degree of orientation will occur, possibly leading to deterioration in film productivity and difficulty in film production. For the present invention, it is important that both low thermal expansion property and low thermal shrinkage property are realized. The film is required to be highly oriented to achieve low thermal expansion property, but a high degree of orientation is not desirable for reduction of the thermal shrinkage. The plane orientation coefficient (fn) can be controlled by varying the film production conditions, and in particular, the heat treatment conditions have large influence. As the heat treatment temperature increases, thermal crystallization is promoted and accordingly the plane orientation coefficient (fn) tends to increase.

It is preferable for the biaxially oriented polyethylene terephthalate film according to the present invention to have a film thickness of 25 to 150 µm. If it is less than 25 µm, the film will deteriorate in bending strength and possibly suffer significant bending and creasing when used in an organic EL device, solar battery, etc. If is it more than 150 Inn, the film will possibly lose softness and decrease in flexibility. The film thickness is more preferably 75 to 125 µm. The film thickness can be controlled by varying the film production conditions.

Production methods for the biaxially oriented PET film according to the present invention are described in detail below, but it should be understood that the invention is not construed as being limited to only those products produced in the examples given below.

First, PET resin samples to be used are prepared. PET samples are produced by either of the following processes. Specifically, they are: process (1) in which terephthalic acid and ethylene glycol, used as input materials, are subjected directly to esterification reaction to produce low molecular weight PET or oligomers, followed by condensation polymerization reaction using antimony trioxide, a titanium compound, or the like as catalysts to provide a polymer, and process (2) in which dimethyl terephthalate and ethylene glycol, used as input materials, are subjected to ester interchange reaction to produce a low molecular weight material, followed by condensation polymerization reaction using antimony trioxide, a titanium compound, or the like as catalysts to provide a polymer.

Here, the esterification reaction can proceed without a catalyst, but commonly a compound such as manganese, calcium, magnesium, zinc, lithium, and titanium is used as catalyst for the ester interchange reaction. In some cases, a phosphorus compound is added after the ester interchange reaction has substantially completed in order to inactivate the catalysts used for the reaction.

PET resin samples to be used for the present invention are prepared as described above, but it is preferred to further increase the degree of polymerization by additionally carrying out solid phase polymerization in order to obtain polyester materials having a high molecular weight and large intrinsic viscosity. There are no specific limitations on the method to be used for the solid phase polymerization, but commonly solid phase polymerization of PET is performed under a reduced pressure or in a nitrogen atmosphere, of which either may be adopted. The solid phase polymerization temperature is preferably 180° C. or more and 240° C. or less, more preferably 190° C. or more and 230° C. or less. If the solid phase polymerization temperature is less than 180° C., the reaction rate will be low and the productivity will deteriorate. If it is more than 240° C., on the other hand, fusion bonding will occur among PET chips, leading to a decrease in productivity. An appropriate solid phase polymerization temperature may be adopted in the above range, but as a general tendency, when polymerization is performed at a low temperature, the reaction rate will be low and it will take a longer period of time to achieve a desired intrinsic viscosity, although the maximum reachable intrinsic viscosity will be higher. If the polymerization temperature is increased, on the contrary, the reaction rate will increase, but degradation reaction will also occur simultaneously, leading to a lower maximum reachable intrinsic viscosity. For a practical process, an optimum reaction temperature may be adopted in the above range of solid phase polymerization temperature taking the desired intrinsic viscosity and reaction time into account.

As a preferable method to allow the film to have an intrinsic viscosity in the above range, the PET resin feeder part of the extruder is filled with an inert gas or preferably the resin is supplied in a flowing nitrogen atmosphere while maintaining the oxygen concentration in the resin feeder part at 0.1 to 0.7 vol %. An oxygen concentration of less than 0.1 vol % is not economically preferable, whereas if the oxygen concentration is more than 0.7 vol %, the PET resin will be oxidized and decomposed, leading to a decrease in intrinsic viscosity in some cases. It is preferably 0.1 vol % to 0.5 vol %.

The crystallization of the biaxially oriented PET film according to the present invention can be accelerated if lithium acetate, magnesium acetate, potassium acetate, phosphorous acid, phosphonic acid, phosphinic acid, derivatives thereof, antimony oxide, or germanium oxide exist during the ester interchange and polymerization. When a crystal nucleating agent is used to accelerate the crystallization, the crystal nucleating agent and the PET resin are preferably kneaded together in advance in a vented twin-screw kneading extruder to prepare master pellets to ensure high handleability and dispersibility.

To make the surface of the biaxially oriented PET film according to the present invention slippery, wear resistant, and scratch resistant, it is preferable to add inorganic particles or organic particles, including, for instance, inorganic particles such as of clay, mica, titanium oxide, calcium carbonate, kaolin, talc, wet silica, dry silica, colloidal silica, calcium phosphate, barium sulfate, alumina, and zirconia; organic particles containing components such as acrylic acid, styrene resin, heat curable resin, silicone, and imide based compounds; and those particles (so-called internal particles) separated out by, for instance, catalysts added in the PET polymerization reaction step.

If inactive particles are to be added to PET that is used as a component of the biaxially oriented PET film according to the present invention, it is preferable that a predetermined quantity of the inactive particles is dispersed in ethylene glycol to form slurry, followed by adding this ethylene glycol slurry during the polymerization step. When adding inactive particles, the particles will be dispersed smoothly if, for instance, the particles in the form of hydrosol or alcohol sol resulting from the synthesis of the inactive particles are added directly without drying them. It is also effective to mix water slurry of inactive particles directly with PET pellets and kneading them into the PET in a vented twin-screw kneading extruder. As a method for adjusting the content of inactive particles, it is effective to first carry out the above procedure to prepare master pellets containing inactive particles at a high concentration and dilute them, at the time of film production, with PET material substantially free of inactive particles to adjust the content of inactive particles.

Then, the pellets prepared above and PET chips, used as input material, are dried under reduced pressure for 3 hours or more at a temperature of 180° C., and subsequently supplied, as a film component, in a nitrogen air flow or under reduced pressure to prevent a decrease in intrinsic viscosity, to an extruder heated at a temperature of 270° C. to 320° C., followed by melt-extruding the material through a slit die and cooling it to solidify on a casting roll to provide an unstretched film. In doing this, it is preferable to use any of various filters such as those of sintered metal, porous ceramic, sand, or metal gauze in order to remove foreign objects and altered polymers. Furthermore, a gear pump may be used, as required, to improve the volumetric feeding capability. When films are to be laminated, two or more extruders and manifolds or confluent blocks are used to stack a plurality of layers of different polymers. It is preferable that the PET chips to be used as input material account for 0.70 to 1.40 dl/g so that film's IV stays in a preferable range. The value of IV of the resin constituting the film for the present invention may be adjusted by mixing chips of PET materials with different IV values as long as the value of IV of the resin constituting the film is in the preferable range.

In addition, various additives including, for instance, compatibilizer, plasticizer, weathering agent, antioxidant, thermal stabilizer, lubricant, antistatic agent, brightening agent, coloring agent, electrically conductive agent, ultraviolet absorber, flame retardant, flame retardation assistant, pigment, and dye may be added as long as they do not impair the effect of the invention.

Subsequently, sheet-like material as produced above is stretched biaxially. It is stretched in two directions, i.e., the machine direction and the transverse direction, and subjected to heat treatment.

Typical stretching methods include sequential biaxial stretching which is carried out by, for instance, stretching first in the machine direction followed by stretching in the transverse direction; simultaneous biaxial stretching which is carried out by using a tool such as simultaneous biaxial tenter to perform stretching in the machine and transverse directions simultaneously; and a combination of sequential biaxial stretching and simultaneous biaxial stretching. Heat treatment is performed after the stretching, but in order to control the coefficient of thermal expansion and the degree of thermal shrinkage in ranges as required for the present invention, it is preferable to perform heat treatment effectively so that the molecular chain orientation will not be relaxed as a result of excessive heat treatment.

Described in more detail below is a biaxial stretching method that uses a longitudinal stretching machine with several rollers in which an unstretched film is stretched in the machine direction by means of the difference in circumferential speed among the rollers, followed by stretching in the transverse direction using a stenter.

First, the unstretched film is stretched in the machine direction. With respect to the stretching temperature, the film is preferably heated by a group of heating rollers maintained preferably in the range from the glass transition temperature (hereinafter referred to as Tg) to (Tg+40)° C., more preferably in the range from (Tg+5)° C. to (Tg+30)° C., and still more preferably in the range from (Tg+10) to (Tg+20), subsequently stretched in the machine direction to a ratio of preferably 3.0 to 4.0, more preferably 3.2 to 4.0, and still more preferably 3.5 to 4.0, and after the stretching, cooled by a group of cooling rollers maintained at temperatures of 20° C. to 50° C. When the film is stretched to a ratio of 3.2 to 4.0, in particular, a high degree of orientation can be achieved and the additional stretching in the next step can be carried out effectively.

Then, a stenter is used to carry out stretching in the transverse direction. Specifically, the preheating temperature is preferably 90° C. to 110° C., more preferably 95° C. to 100° C. The stretching temperature is preferably in the range from (preheat temperature −5)° C. to (preheat temperature +5)° C. The stretching ratio is preferably 3.0 to 6.0, more preferably 3.5 to 6.0, and still more preferably 3.7 to 6.0.

Then, this stretched film is subjected to heat set treatment under tension and relaxation annealing treatment. As described above, an increase in the intrinsic viscosity (IV) of the resin that constitutes the film will serve to increase the plane orientation and decrease the coefficent of thermal expansion, but the thermal shrinkage will increase. According to the present invention, implementation of heat set treatment and relaxation annealing treatment as described below serves to depress thermal shrinkage even if the film has a large intrinsic viscosity (IV), thereby achieving both low thermal expansion property and a low thermal shrinkage.

For the present invention, the heat set following the stretching steps is preferably performed stepwise in two or more stages at different temperatures. The implementation of the above heat set treatment is preferable because it serves to prevent the relaxation of orientation from being caused by heat treatment and promote crystal orientation, thereby increasing the thermal dimensional stability. With respect to the heat set temperature, the heat set temperature at the anterior stages (hereinafter, occasionally abbreviated as Ths1) (° C.) is preferably 150° C. or more and 210° C. or less while the heat set temperature at the final stage (hereinafter, occasionally abbreviated as Ths2) (° C.) is preferably more than 210° C. and 245° C. or less. Here, the anterior stages defined for the present invention refer to all stages but the final one in the heat set treatment step that consists of two or more stages. For a heat set treatment step that consists of three stages, for example, the anterior stages are the first and second ones and the final stage is the third one. If the heat set temperature in the anterior stages, Ths1, is a temperature between the glass transition temperature (Tg) and the melting point (Tm) of the PET resin, it is preferable because crystallization may be promoted easily while the relaxation of orientation is depressed so that small-sized crystallites are formed from precursors having a crystal structure. Specifically, as described above, it is preferably 150° C. or more and 210° C. or less, more preferably 150° C. or more and 200° C. or less, still more preferably 165° C. or more and 200° C. or less, and most preferably 165° C. or more and 190° C. or less. If the heat set temperature at the final stage, Ths2, is a temperature between Ths1 and the melting point (Tm), it is preferable because the crystal structure is fixed and the degree of thermal shrinkage is decreased. Specifically, it is preferably more than 210° C. and 245° C. or less, more preferably more than 210° C. and 240° C. or less, and still more preferably 220° C. or more and 230° C. or less. For the present invention, the heat set treatment at the anterior stages is set in the temperature range where the relaxation of orientation is depressed so that small-sized crystallites are formed from precursors having a crystal structure, thereby preventing excessive relaxation of orientation and removing local molecular strains. Then, the overall internal strains are removed by the heat set treatment at the final stage to reduce the thermal shrinkage. Thus, this depresses the increase in coefficent of thermal expansion caused by the relaxation of orientation, thereby allowing the thermal shrinkage to be reduced. If heat set treatment of the film according to the present invention is carried out in three or more stages, the heat set temperature is preferably increased gradually from the first to the final stage while maintaining Ths1 and Ths2 in the preferable temperature ranges. With respect to the duration of heat set, each of the anterior heat set stages lasts preferably for 1 second to 1,000 seconds, more preferably 1 second to 60 seconds, and still more preferably 1 second to 30 seconds. The final heat set stage also lasts preferably for 1 second to 1,000 seconds, more preferably 1 second to 60 seconds, and still more preferably 1 second to 10 seconds. Furthermore, the entire duration of heat set is preferably 2,000 seconds or less, more preferably 120 seconds or less, still more preferably 30 seconds or less, and particularly preferably 20 seconds or less. For the present application the invention, the heat set treatment step preferably consists of two or more stages, and in view of the entire heat set duration, it preferably consists of two or more and three or less stages.

Before being sent to the cooling step, furthermore, the film is preferably subjected to relaxation treatment in the transverse direction at a temperature not lower than the widthwise stretching temperature and not higher than Ths2 (° C.). It is preferable for the degree of relaxation (hereinafter, occasionally referred as Rxhs) to be equal to or less than three times the degree of relaxation in the relaxation annealing treatment step to be performed after the cooling step (hereinafter, occasionally referred as Rxa). The degree of relaxation is defined as the ratio of the decrease in width caused by the treatment to the width measured before the treatment, and for instance, a degree of relaxation of 2% means that a width of 100 mm before treatment is decreased by 2% or 2 mm to 98 mm as a result of relaxation treatment. If Rxhs is more than three times Rxa, orientation may possibly be relaxed excessively, leading to an undesired decrease in the coefficient of thermal expansion. It is preferable for Rxhs to be 0% to 9%.

Subsequently, the film is cooled at a temperature of preferably 35° C. or less, more preferably 25° C. or less, and wound up on a core after removing the edges. In order to increase the thermal dimensional stability, furthermore, it is preferable for the wound-up biaxially stretched PET film to be conveyed, preferably under tension at an appropriate temperature, and subjected to relaxation annealing treatment to remove strains in the molecular structure and decrease the coefficient of thermal shrinkage. The temperature of relaxation annealing treatment is preferably lower than the heat set temperature at the final stage, Ths2, and specifically, it is more preferably 200° C. or more and 235° C. or less, and still more preferably 205° C. to 220° C. If it is more than 235° C., the structure fixed by heat set treatment tends to be relaxed again, leading to relaxation of the plane orientation and deterioration in the coefficient of thermal expansion. If it is 200° C. or less, strains in the molecular structure may not be removed completely by the annealing treatment, leaving thermal shrinkage at high temperatures unremoved. The relaxation annealing treatment duration is preferably 1 to 120 seconds, more preferably 5 to 90 seconds, and still more preferably 20 to 60 seconds. The degree of relaxation (Rxa) caused by the relaxation annealing treatment is preferably 0.1% to 3%. If Rxa is less than 0.1%, recognizable relaxation will not take place and strains in the molecular structure will not be removed completely, possibly failing to decrease the thermal shrinkage. If Rxa is more than 3%, orientation may be relaxed excessively, possibly leading to deterioration in the coefficient of thermal expansion. An appropriate Rxa value can be set by varying the stretching tension and clip interval in the relaxation annealing step. The biaxially oriented PET film according to the present invention can be obtained by subjecting the film to annealing treatment while conveying it at a speed of 10 to 300 m/min.

For the present invention, the PET film or rolls of the PET film may be subjected to other appropriate processing steps as required such as molding, surface treatment, lamination, coating, printing, embossing, and etching.

For example, a transparent electrically conductive layer of ITO with a thickness of 250 nm may be formed on the resulting film according to a procedure as follows: the chamber is evacuated to a pressure of $5 \times 10^{-4}$ Pa before starting plasma discharge; argon and oxygen are introduced into the chamber to a pressure of 0.3 Pa (partial pressure of oxygen 3.7 mPa); and using, as target, indium oxide containing 36 mass % of tin oxide (manufactured by Sumitomo Metal Mining Co., Ltd., density 6.9 g/cm$^3$), direct current magnetron sputtering is carried out by applying electric power with a power density of 2 W/cm$^2$. In addition, an organic EL layer may be formed on the layer to provide an organic EL display substrate or organic EL illumination substrate. Furthermore, a flexible solar battery substrate can be produced by forming a power generation layer. A barrier substrate may also be provided by forming a barrier layer on the resulting film by, for example, coating, vacuum deposition, or chemical vapor deposition (CVD).

High in thermal dimensional stability and also high in transparency, the film according to the present invention can be used favorably as organic EL substrate, flexible solar battery substrate, and barrier substrate.

(Methods for Measurement of Properties and Methods for Evaluation of Effects)

The methods for measurement of characteristic values and methods for evaluation of effects used for the present invention are as described below.

(1) Crystallinity Index ($\Delta$Tcg (° C.)), Degree of Crystallinity (Xc)

In a differential scanning calorimeter (RDC6220) and a data analysis system (Disk Station SSC/5200), both manufactured by Seiko Instruments Inc., a specimen of 5 mg was mounted using an aluminum pan and pan cover and heated in a nitrogen atmosphere from 25° C. to 300° C. at a heating rate of 10° C./min according to JIS K7121 (1987). Subsequently, it was quenched in liquid nitrogen and heated again in a nitrogen atmosphere from 20° C. to 300° C. at a rate of 10° C./min. With respect to the glass transition temperature (Tg) and cold crystallization temperature (Tcc) to be used for the present invention, the measurements of the glass transition temperature (Tg) and cold crystallization temperature (Tcc) taken in the second heating step were adopted and the crystallinity index ($\Delta$Tcg) was calculated by the following equation.

$$\Delta Tcg = Tcc - Tg$$

The degree of crystallinity (Xc) was calculated from the heat of melting ($\Delta H_m$) and heat of cold crystallization ($\Delta H_c$) in the second heating step by the following equation.

$$Xc = (\Delta H_m - \Delta H_c)/\Delta H_m^0$$

Here, $\Delta Hm^0$ is the heat of melting of perfect crystal and it was assumed to be 140.1 J/g (reference: Wunderlich B, Thermal analysis of Polymeric Materials) in the calculation.

(2) Minor Melting Peak Temperature (T-Meta (° C.))

Using a differential scanning calorimeter (RDC220) and a data analysis system (Disk Station SSC/5200), both manufactured by Seiko Instruments Inc., a specimen of 5 mg on an aluminum tray was heated from 25° C. to 300° C. at a heating rate of 20° C./min according to JIS K7121 (1987). The temperature at the endothermic peak observed in the melting process was adopted as the melting point (Tm) and the temperature of a minute endothermic peak that appeared at a temperature near and slightly below Tm (not lower than 150° C. and not higher than Tm) was adopted as T-meta. (Here, T-meta represents the heat history associated with the heat set temperature and therefore, can be confirmed as such by checking that it is observed in the first run of DSC measurement but not in a second run that is performed after heating the specimen up to above Tm to remove the heat history.).

(3) Intrinsic Viscosity

A 1.2 g portion of the film is dissolved in 100 ml of orthochlorophenol and the viscosity of the resulting solution measured at a temperature of 25° C. is used to calculate the intrinsic viscosity by the following equation.

$$\eta sp/C = [\eta] + K[\eta]^2 \times C$$

Here, ηsp is equal to (solution viscosity/solvent viscosity)−1 and C and K denote the weight of the dissolved polymer per 100 ml of the solvent (g/100 ml, commonly equal to 1.2) and the Huggins constant (assumed to be 0.343), respectively. The solution viscosity and the solvent viscosity, furthermore, are measured by using an Ostwald viscometer.

(4) Coefficent of Thermal Expansion

For three specimens, measurements were made in the machine direction and in the transverse direction according to JIS K7197 (1991) under the following conditions, and their averages were calculated to determine the coefficent of thermal expansion in the machine direction and the transverse direction. Here, if the machine direction and the transverse directions of the film for the present invention are known, then calculations are made as described below. In the case where a film specimen has a roughly rectangular shape but their machine and transverse directions are not apparent, the longer side may be assumed to be in the machine direction while the direction perpendicular to it is assumed to be the transverse direction in making the following calculations (if a film specimen has a roughly square shape, either of the directions parallel to its sides may be assumed to be the machine or transverse direction).

Measuring equipment: TMA/SS6000 manufactured by Seiko Instruments Inc.
  Specimen size: width of 4 mm and length of 20 mm
  Temperature conditions: heated at 5° C./min from 30° C. to 170° C. which was maintained for 10 minutes.
  Then cooled at 5° C./min from 170° C. to 50° C. which was maintained for 20 minutes.
  Load conditions: 29.4 mN (constant)

Here, the coefficent of thermal expansion was measured in the temperature range of 170° C. to 50° C. during the cooling period. The coefficent of thermal expansion was calculated by the following equation for three specimens and their average was determined.

$$\text{Coefficent of thermal expansion [ppm/° C.]} = 10^6 \times \{(\text{size (mm) at } 170° \text{C.}) - (\text{size (mm) at } 50° \text{C.})\} / \{20 \text{ (mm)} \times (170° \text{C.} - 50° \text{C.})\}$$

(5) Degree of Thermal Shrinkage at 180° C.

The degree of thermal shrinkage was measured using the following equipment under the following conditions.

Length measuring machine: all-purpose projector
  Specimen size: specimen length of 150 mm×width of 10 mm
  Heat treatment equipment: Geer type oven
  Heat treatment conditions: 180° C. for 30 min
  Load: 3 g
  Calculation method Gage marks were made on a specimen at an interval of 100 mm before the start of heat treatment and the distance between the gage marks were measured after the end of heat treatment. The degree of thermal shrinkage was calculated from the change in the distance between the gage marks caused by the heat treatment and used as indicator of dimensional stability. For each film sample, five specimens were used for measurement in the machine and transverse directions, and evaluation was carried out based on the average of the measurements.

(6) Film Haze

A specimen of 10 cm×10 cm was cut out of a film sample and its haze value was measured by a fully automatic, direct reading type Haze Computer HGM-2DP (manufactured by Suga Test Instruments Co., Ltd.) according to JIS K7105 (1985). Measurements were made for 10 randomly sampled specimens, and their average was adopted as the haze value of the film sample.

(7) Change in Film Haze

A specimen of 10 cm×10 cm is cut out of a film sample and heated for 30 minutes in an oven heated at 180° C. Afterwards, the film haze was measured by the method described above to determine the film haze after the heat treatment and the change in film haze calculated by the following equation was used for evaluation of optical characteristics. A film sample is unacceptable if it is ranked as C.

change in film haze=(film haze after heat treatment)−
    (film haze before heat treatment)

A: Change in film haze is 1.5% or less.
B: Change in film haze is more than 1.5% and 3% or less.
C: Change in film haze is more than 3%.

(8) Thermal Dimensional Stability

A specimen of 100 mm width×100 mm length was cut out of a biaxially oriented polyethylene terephthalate film sample according to the present invention and used to produce a transparent electrically conductive layer as described below assuming its application to an organic flexible device, and the thermal dimensional stability was evaluated based on measurements of surface resistivity, dimensional changes, and the like.

Processing suitability

The chamber was evacuated to a pressure of $5 \times 10^{-4}$ Pa before starting plasma discharge, and argon and oxygen were introduced into the chamber to a pressure of 0.3 Pa (partial pressure of oxygen 3.7 mPa). Indium oxide containing 36 mass % of tin oxide (manufactured by Sumitomo Metal Mining Co., Ltd., density 6.9 g/cm³) was used as target, and direct current magnetron sputtering was carried out by applying electric power with a power density of 2 W/cm² to form a transparent electrically conductive layer of ITO with a thickness of 250 nm. If the biaxially oriented polyethylene terephthalate film suffers large thermal expansion, cracking will take place in the transparent electrically conductive layer to decrease the surface resistivity. Evaluation was conducted according to the following criteria. A film sample is unacceptable if it is ranked as D.

AA: A transparent electrically conductive layer with a surface resistivity of less than 30 Ω/□ was formed successfully.
A: A cracked transparent electrically conductive layer with a surface resistivity of 30 Ω/□ or more and less than 50Ω/□ was formed.
B: A considerably cracked transparent electrically conductive layer with a surface resistivity of 50Ω/□ or more and less than 100Ω/□ was formed.
C: A considerably cracked transparent electrically conductive layer with a surface resistivity of 100Ω/□ or more and less than 125Ω/□ was formed.

D: The resulting film had a surface resistivity of 125Ω/□ or more, or a transparent electrically conductive layer could not be formed due to problems such as curling and width shrinkage.

Curling properties

A biaxially oriented polyethylene terephthalate film specimen with a transparent electrically conductive layer formed thereon was left in an oven at a temperature 180° C. for 30 minutes. Subsequently, it is left under the conditions of a temperature of 23° C. and humidity of 65% RH for 30 minutes, and then the state of curling at the four corners was observed. The average of measured warp (mm) at the four corners was calculated, and evaluation was conducted according to the following criteria. The curling properties improve with a decrease in both coefficent of thermal expansion and degree of thermal shrinkage. A film specimen is unacceptable if it is ranked as D.

AA: The size of warp is less than 5.0 mm.
A: The size of warp is 5.0 mm or more and less than 7.5 mm.
B: The size of warp is 7.5 mm or more and less than 10 mm.
C: The size of warp is 10 mm or more and less than 12.5 mm.
D: The size of warp is more than 12.5 mm.

EXAMPLES

Embodiments of the present invention are described with reference to Examples.

Reference Example 1

First, 194 parts by mass of dimethyl terephthalate and 124 parts by mass of ethylene glycol were put in an ester interchange reaction apparatus and heated at a temperature of 140° C. to ensure dissolution. Subsequently, 0.1 part by mass of magnesium acetate tetrahydrate and 0.03 part by mass of antimony trioxide were added while stirring the content, which was then subjected to ester interchange reaction while distilling out methanol at a temperature of 140° C. to 230° C. Then, 1 part by mass of a 5 mass % solution of trimethyl phosphate in ethylene glycol (0.05 part by mass of trimethyl phosphate) was added. The addition of the solution of trimethyl phosphate in ethylene glycol acts to decrease the temperature of the content. The stirring of the content was continued while distilling out excess ethylene glycol, until the temperature returned to 230° C. After the temperature of the content in the ester interchange reaction apparatus had reached 230° C., the content was transferred to a polymerization apparatus. After the transfer, the reaction system was heated gradually from a temperature of 230° C. up to a temperature of 290° C. while decreasing the pressure down to 0.1 kPa. Both the time required to reach the final temperature and the time required to reach the final pressure were adjusted to 60 min. The stirring torque in the polymerization apparatus came to a predetermined value (depending on specifications of the polymerization apparatus, the torque shown by polyethylene terephthalate with an intrinsic viscosity 0.65 in this polymerization apparatus was used as the "predetermined value") when the reaction was continued for 2 hours after a final temperature and final pressure were reached (a total of 3 hours after the onset of polymerization). Here, the condensation polymerization reaction was stopped after purging nitrogen from the reaction system to restore atmospheric pressure, and the reaction product was discharged into cold water to produce a strand, which was cut immediately to provide polyethylene terephthalate having an intrinsic viscosity of 0.65, which was referred to as PET Pellet $X_{0.65}$.

Reference Example 2

Using a rotatory vacuum polymerization apparatus, PET Pellet $X_{0.65}$ obtained in Reference example 1 was subjected to solid phase polymerization for 15 hours at a temperature of 230° C. under a reduced pressure of 0.1 kPa to provide PET Pellet $X_{0.77}$, which had an intrinsic viscosity of 0.77.

Reference Example 3

Using the rotatory vacuum polymerization apparatus, PET Pellet $X_{0.65}$ obtained in Reference example 1 was subjected to solid phase polymerization for 5 hours at a temperature of 230° C. under a reduced pressure of 0.1 kPa to provide PET Pellet $X_{0.70}$ which had an intrinsic viscosity of 0.70.

Reference Example 4

Using the rotatory vacuum polymerization apparatus, PET Pellet $X_{0.65}$ obtained in Reference example 1 was subjected to solid phase polymerization for 100 hours at a temperature of 230° C. under a reduced pressure of 0.1 kPa to provide PET Pellet $X_{0.90}$, which had an intrinsic viscosity of 0.90.

Reference Example 5

Using the rotatory vacuum polymerization apparatus, PET Pellet $X_{0.65}$ obtained in Reference example 1 was subjected to solid phase polymerization for 200 hours at a temperature of 230° C. under a reduced pressure of 0.1 kPa to provide PET Pellet $X_{1.20}$, which had an intrinsic viscosity of 1.20.

Reference Example 6

Except for adding 0.35 part by mass of dimethylphenyl phosphonate (DPPO) as crystal nucleating agent instead of trimethyl phosphate, the same procedure as in Reference example 2 was carried out to perform ester interchange reaction and polymerization reaction to produce PET Pellet $Y_{0.77}$, which had an intrinsic viscosity of 0.77 and an adjusted crystallization rate.

Example 1

After drying under reduced pressure at a temperature of 180° C. for 3 hours, PET Pellet $X_{0.77}$ with an intrinsic viscosity of 0.77 prepared in Reference example 2 was supplied to an extruder heated at a temperature of 280° C. and introduced to a T-die nozzle in a nitrogen atmosphere. Then, the melt was extruded from the T-die nozzle in a sheet-like form to prepare a molten monolayer sheet, which was then cooled and solidified by applying static electricity to bring it into close contact with a drum with a surface maintained at a temperature of 25° C., thereby providing unstretched monolayer film.

Subsequently, the resulting unstretched monolayer film was preheated by a group of heated rollers and stretched to a ratio of 3.5 in the machine direction at a temperature of 88° C., and cooled by a group of rollers at a temperature of 25° C. to provide uniaxially stretched film. The resulting uniaxially stretched film, with its ends held by clips, was supplied to a preheating zone maintained at a temperature of 90° C. in a tenter, and continuously fed to a heating zone where it was stretched 3.7 times at a temperature of 95° C. in the transverse direction which was perpendicular to the machine direction. Furthermore, in the heat treatment zone of the tenter, the film was then heat-treated at a first-stage (anterior-stage) heat set temperature (Ths1) of 180° C. for 5 seconds and then at a second-stage (final-stage) heat set temperature (Ths2) of 225° C. for 8 seconds. This is followed by treatment for relaxation of 2% in the transverse direction at a temperature of 215° C. Subsequently, the film was cooled uniformly down to 25° C. and the edges of the film were removed, followed by winding up on a core to provide biaxially stretched film with a thickness of 100 μm.

While being conveyed at a speed of 30 m/min, the film was subjected to relaxation annealing treatment at a temperature of 205° C. for 30 seconds to achieve 1% relaxation, thereby providing biaxially stretched polyethylene terephthalate film.

Evaluation of the resulting biaxially oriented polyethylene terephthalate film showed that it had considerably high thermal dimensional stability as given in Table.

Example 2

Except that the first-stage heat set temperature (Ths1) was set to 160° C., the same procedure as in Example 1 was carried out to produce biaxially oriented polyethylene terephthalate film. Evaluation of the resulting polyethylene terephthalate film showed that the film had high thermal dimensional stability.

Example 3

Except that the first-stage heat set temperature (Ths1) was set to 200° C., the same procedure as in Example 1 was carried out to produce biaxially oriented polyethylene terephthalate film. Evaluation of the resulting polyethylene terephthalate film showed that the film had high thermal dimensional stability.

Example 4

Except that the second-stage (final-stage) heat set temperature (Ths2) was set to 215° C., the same procedure as in Example 1 was carried out to produce biaxially oriented polyethylene terephthalate film. Evaluation of the resulting polyethylene terephthalate film showed that the film had high thermal dimensional stability.

Example 5

Except that the second-stage (final-stage) heat set temperature (Ths2) was set to 235° C., the same procedure as in Example 1 was carried out to produce biaxially oriented polyethylene terephthalate film Evaluation of the resulting polyethylene terephthalate film showed that the film had high thermal dimensional stability.

Example 6

Except for using PET Pellet $X_{0.70}$ obtained in Reference example 3, the same procedure as in Example 1 was carried out to produce biaxially oriented polyethylene terephthalate film. Evaluation of the resulting polyethylene terephthalate film showed that the film had high thermal dimensional stability.

Example 7

Except for using PET Pellet $X_{0.90}$ obtained in Reference example 4, the same procedure as in Example 1 was carried out to produce biaxially oriented polyethylene terephthalate film. Evaluation of the resulting polyethylene terephthalate film showed that the film had high thermal dimensional stability.

Example 8

Except for using a mixture of 95 parts by weight of PET Pellet $X_{0.77}$ obtained in Reference example 2 and 5 parts by weight of PET Pellet $Y_{0.77}$ obtained in Reference example 6, the same procedure as in Example 1 was carried out to produce biaxially oriented polyethylene terephthalate film. Evaluation of the resulting polyethylene terephthalate film showed that the film had high thermal dimensional stability.

Example 9

Except for dividing the heat set step into four stages, performing the first-stage heat set at a heat set temperature (Ths1) of 180° C. for 5 seconds, performing the second-stage heat set at a heat set temperature (Ths1) of 190° C. for 5 seconds, performing the third-stage heat set at a heat set temperature (Ths1) of 200° C. for 5 seconds, and performing the fourth-stage (final-stage) heat set at a heat set temperature (Ths2) of 225° C. for 8 seconds, the same procedure as in Example 1 was carried out to produce biaxially oriented polyethylene terephthalate film Evaluation of the resulting polyethylene terephthalate film showed that the film had high thermal dimensional stability.

Example 10

Except that the first-stage heat set temperature (Ths1) was set to 210° C., the same procedure as in Example 1 was carried out to produce a polyethylene terephthalate film. Evaluation of the resulting polyethylene terephthalate film showed that the film had high thermal dimensional stability.

Example 11

Except that the final-stage heat set temperature (Ths2) was set to 245° C., the same procedure as in Example 1 was carried out to produce a polyethylene terephthalate film. Evaluation of the resulting polyethylene terephthalate film showed that the film had high thermal dimensional stability.

Example 12

Using two extruders, 30 parts by weight of PET Pellet $X_{0.65}$ obtained in Reference example 1 and 70 parts by weight PET Pellet $X_{0.70}$ obtained in Reference example 3 were supplied to the primary extruder while PET Pellet $X_{0.77}$ obtained in Reference example 2 was supplied to the secondary extruder. Except that the resin streams are combined into a structure in which a layer supplied to the primary extruder is sandwiched between layers of the component supplied to the secondary extruder so that the thickness ratio of (the layer of the component from the secondary extruder):(the layer of the component from the primary extruder):(the layer of the component from the secondary extruder) was 3:14:3 and that the three molten layers were extruded together from a T-die nozzle, the same procedure as in Example 1 was carried out to produce biaxially oriented polyethylene terephthalate film. Evaluation of the resulting polyethylene terephthalate film showed that the film had high thermal dimensional stability.

Comparative Example 1

Except that the first-stage heat set temperature (Ths1) was set to 145° C., the same procedure as in Example 1 was carried out to produce a polyethylene terephthalate film. Evaluation of the resulting polyethylene terephthalate film showed that the film had inferior thermal dimensional stability with an increased degree of thermal shrinkage.

Comparative Example 2

Except that the final-stage heat set temperature (Ths2) was set to 200° C., the same procedure as in Example 1 was carried out to produce a polyethylene terephthalate film. Evaluation of the resulting polyethylene terephthalate film showed that the film had inferior thermal dimensional stability with an increased degree of thermal shrinkage.

Comparative Example 3

Except for using PET Pellet $X_{0.65}$ obtained in Reference example 1, the same procedure as in Example 1 was carried out to produce biaxially oriented polyethylene terephthalate film. Evaluation of the resulting polyethylene terephthalate film showed that the film had inferior optical characteristics with an increased change in haze.

Comparative Example 4

Except for using PET Pellet $X_{1.20}$ obtained in Reference example 5, the same procedure as in Example 1 was carried out to produce biaxially oriented polyethylene terephthalate film. Evaluation of the resulting polyethylene terephthalate film showed that the film had inferior thermal dimensional stability with an increased degree of thermal shrinkage.

Comparative Example 5

Except that heat treatment for heat set performed at a temperature of 235° C. for 5 seconds in the heat treatment zone in the tenter and that treatment for relaxation of 2% in the transverse direction was subsequently performed at a temperature of 235° C., the same procedure as in Example 1 was carried out to produce a polyethylene terephthalate film. Evaluation of the resulting polyethylene terephthalate film showed that the film had inferior thermal dimensional stability with a deteriorated coefficient of thermal expansion.

Comparative Example 6

Except that heat treatment for heat set performed at a temperature of 210° C. for 5 seconds in the heat treatment zone in the tenter and that treatment for relaxation of 2% in the transverse direction was subsequently performed at a temperature of 210° C., the same procedure as in Example 1 was carried out to produce polyethylene terephthalate film. Evaluation of the resulting polyethylene terephthalate film showed that the film had inferior thermal dimensional stability with deteriorated thermal shrinkage.

Comparative Example 7

Heat treatment for heat set was performed at a temperature of 190° C. for 5 seconds in the heat treatment zone in the tenter and subsequently treatment for relaxation of 2% in the transverse direction was performed at a temperature of 190° C. Except that relaxation annealing treatment was performed at a temperature of 180° C., the same procedure as in Example 1 was carried out to produce polyethylene terephthalate film. Evaluation of the resulting polyethylene terephthalate film showed that the film had inferior thermal dimensional stability with largely deteriorated thermal shrinkage.

[Table 1]

TABLE 1

| | heat treatment conditions for film production | | properties | | | | | | | | | evaluation | | |
|---|---|---|---|---|---|---|---|---|---|---|---|---|---|---|
| | anterior-stage heat set temperature | final-stage heat set temperature | intrinsic viscosity | degree of crystallinity | coefficient of thermal expansion at 50-170° C. | | thermal shrinkage at 180° C. | | minor melting peak | film haze | change in haze (180° C.) | thermal dimensional stability | | optical characteristics change in haze |
| | Ths1 | Ths2 | IV | Xc | [ppm/° C.] | | [%] | | T-meta | | | processing suitability | curling properties | |
| | [° C.] | [° C.] | [dl/g] | [—] | MD | TD | MD | TD | [° C.] | [%] | [%] | | | |
| Example 1 | 180 | 225 | 0.75 | 0.39 | 20 | 20 | 0.4 | 0.4 | 225 | 1.5 | 1 | AA | AA | A |
| Example 2 | 160 | 225 | 0.75 | 0.38 | 18 | 18 | 0.8 | 0.8 | 225 | 1.5 | 1 | AA | B | A |
| Example 3 | 200 | 225 | 0.75 | 0.39 | 23 | 23 | 0.3 | 0.3 | 225 | 1.5 | 1 | A | A | A |
| Example 4 | 180 | 215 | 0.75 | 0.36 | 19 | 19 | 0.7 | 0.7 | 215 | 1.5 | 1 | AA | A | A |
| Example 5 | 180 | 235 | 0.75 | 0.43 | 23 | 23 | 0.3 | 0.3 | 235 | 1.5 | 1 | A | A | A |
| Example 6 | 180 | 225 | 0.68 | 0.40 | 25 | 25 | 0.3 | 0.3 | 225 | 1.5 | 2 | B | B | B |
| Example 7 | 180 | 225 | 0.85 | 0.39 | 17 | 17 | 0.6 | 0.6 | 225 | 1.5 | 0.5 | AA | A | A |
| Example 8 | 180 | 225 | 0.75 | 0.41 | 20 | 20 | 0.2 | 0.2 | 225 | 2.5 | 1 | AA | AA | A |
| Example 9 | 180/190/200 | 225 | 0.75 | 0.39 | 22 | 22 | 0.3 | 0.3 | 225 | 1.5 | 1 | A | A | A |
| Example 10 | 210 | 225 | 0.75 | 0.39 | 26 | 26 | 0.3 | 0.3 | 225 | 1.5 | 1 | C | C | A |
| Example 11 | 180 | 245 | 0.75 | 0.46 | 28 | 28 | 0.2 | 0.2 | 245 | 1.5 | 1 | C | C | A |
| Example 12 | 180 | 225 | 0.67 | 0.40 | 29 | 29 | 0.2 | 0.2 | 225 | 1.5 | 2 | C | C | B |
| Comparative example 1 | 145 | 225 | 0.75 | 0.39 | 18 | 18 | 1.2 | 1.2 | 225 | 1.5 | 1 | AA | D | A |
| Comparative example 2 | 180 | 200 | 0.75 | 0.33 | 18 | 18 | 1.5 | 1.5 | 200 | 1.5 | 1 | AA | D | A |
| Comparative example | 180 | 225 | 0.62 | 0.40 | 27 | 27 | 0.3 | 0.3 | 225 | 1.5 | 4 | C | C | C |

TABLE 1-continued

| | heat treatment conditions for film production | | properties | | | | | | | | | evaluation | | |
|---|---|---|---|---|---|---|---|---|---|---|---|---|---|---|
| | anterior-stage heat set temperature | final-stage heat set temperature | intrinsic viscosity | degree of crystallinity | coefficient of thermal expansion at 50-170° C. | | thermal shrinkage at 180° C. | | minor melting peak | film haze | change in haze (180° C.) | thermal dimensional stability | | optical characteristics change in haze |
| | Ths1 | Ths2 | IV | Xc | [ppm/° C.] | | [%] | | T-meta | haze | | processing | curling | in |
| | [° C.] | [° C.] | [dl/g] | [—] | MD | TD | MD | TD | [° C.] | [%] | [%] | suitability | properties | haze |
| example 3 | 180 | 225 | 1.15 | 0.38 | 15 | 15 | 1.3 | 1.3 | 225 | 1.5 | 0.3 | AA | D | A |
| Comparative example 4 | | 235 | 0.75 | 0.43 | 30 | 30 | 0.1 | 0.1 | 235 | 1.5 | 1 | D | C | A |
| Comparative example 5 | | 210 | 0.75 | 0.31 | 24 | 24 | 1.2 | 1.2 | 210 | 1.5 | 1 | B | D | A |
| Comparative example 6 | | 190 | 0.75 | 0.29 | 21 | 21 | 2.1 | 2.1 | 190 | 1.5 | 1 | A | D | A |
| Comparative example 7 | | | | | | | | | | | | | | |

In Table, "thermal shrinkage at 180° C." means the degree of thermal shrinkage at 180° C., and MD and TD means the machine direction and the transverse direction, respectively.

INDUSTRIAL APPLICABILITY

The biaxially oriented polyethylene terephthalate film according to the present invention can serve as base film for flexible devices having high thermal dimensional stability and curling property. Accordingly, it may be useful to produce products such as organic EL display, electronic paper, organic EL lighting, organic solar battery, dye-sensitized solar battery, and barrier film.

The invention claimed is:

1. A biaxially oriented polyethylene terephthalate film comprising:
    at least polyethylene terephthalate resin and having a degree of crystallinity (Xc) of more than 0.35 and 0.50 or less,
    the resin that constitutes the film having an intrinsic viscosity (IV) of 0.66 to 1.0 dl/g, and
    the film having a coefficient of thermal expansion of 0 to 29 ppm/° C. in a temperature range of 50° C. to 170° C. in both the film's machine direction and transverse direction and a degree of thermal shrinkage of −0.5% to 1.0% at 180° C. in both the film's machine direction and transverse direction.

2. The biaxially oriented polyethylene terephthalate film as described in claim 1, wherein the intrinsic viscosity (IV) of the resin that constitutes the film is 0.68 to 1.0 dl/g.

3. The biaxially oriented polyethylene terephthalate film as described in claim 1, wherein both the coefficient of thermal expansion in the machine direction of the film and that in its transverse direction are 0 to 25 ppm/° C. in a temperature range of 50° C. to 170° C.

4. The biaxially oriented polyethylene terephthalate film as described in claim 1, wherein a minor melting peak temperature (T-meta) occurs at 210° C. to 240° C.

5. The biaxially oriented polyethylene terephthalate film as described in claim 1, wherein the film haze is 0% to 3%.

6. The biaxially oriented polyethylene terephthalate film as described in claim 1, wherein the change in film haze is 0% to 3.0% when the film is heat-treated at 180° C. for 30 minutes.

7. The biaxially oriented polyethylene terephthalate film as described in claim 1 that is produced by:
    melt-extruding polyethylene terephthalate resin while cooling for solidification to provide unstretched film,
    biaxially stretching the unstretched film and heat-setting it in two or more stages differing in temperature, the heat set temperature at the anterior heat set stages, Ths1 (° C.), being 150° C. to 200° C., and the heat set temperature at the final stage, Ths2 (° C.), being 210° C. to 240° C., to provide biaxially stretched film,
    cooling the biaxially stretched film at a temperature of 35° C. or lower after the heat set to provide cooled biaxially stretched film, and
    subjecting the cooled biaxially stretched film to relaxation annealing treatment at a temperature higher than 200° C. and 235° C. or lower to provide the biaxially oriented polyethylene terephthalate film.

8. A production method for biaxially oriented polyethylene terephthalate film as described in claim 1 comprising:
    melt-extruding polyethylene terephthalate resin while cooling for solidification to provide unstretched film,
    biaxially stretching the unstretched film and heat-setting it in two or more stages differing in temperature, the heat set temperature at the anterior heat set stages, Ths1 (° C.), being 150° C. to 200° C., and the heat set temperature at the final stage, Ths2 (° C.), being 210° C. to 240° C., to provide biaxially stretched film,
    cooling the biaxially stretched film at a temperature of 35° C. or lower after the heat set, and
    subjecting the cooled biaxially stretched film to relaxation annealing treatment at a temperature higher than 200° C. and 235° C. or lower to provide the biaxially oriented polyethylene terephthalate film.

9. The film for organic EL substrates comprising biaxially oriented polyethylene terephthalate film as described in claim 1.

10. The film for flexible solar battery substrates comprising biaxially oriented polyethylene terephthalate film as described in claim 1.

11. The film for barrier substrates comprising biaxially oriented polyethylene terephthalate film as described in claim 1.

12. The biaxially oriented polyethylene terephthalate film as described in claim 2, wherein both the coefficient of thermal expansion in the machine direction of the film and that in its transverse direction are 0 to 25 ppm/° C. in a temperature range of 50° C. to 170° C.

13. The biaxially oriented polyethylene terephthalate film as described in claim 2, wherein a minor melting peak temperature (T-meta) occurs at 210° C. to 240° C.

14. The biaxially oriented polyethylene terephthalate film as described in claim 3, wherein a minor melting peak temperature (T-meta) occurs at 210° C. to 240° C.

15. The biaxially oriented polyethylene terephthalate film as described in claim 2, wherein the film haze is 0% to 3%.

16. The biaxially oriented polyethylene terephthalate film as described in claim 3, wherein the film haze is 0% to 3%.

17. The biaxially oriented polyethylene terephthalate film as described claim 4, wherein the film haze is 0% to 3%.

18. The biaxially oriented polyethylene terephthalate film as described in claim 2, wherein the change in film haze is 0% to 3.0% when the film is heat-treated at 180° C. for 30 minutes.

19. The biaxially oriented polyethylene terephthalate film as described in claim 3, wherein the change in film haze is 0% to 3.0% when the film is heat-treated at 180° C. for 30 minutes.

20. The biaxially oriented polyethylene terephthalate film as described in claim 4, wherein the change in film haze is 0% to 3.0% when the film is heat-treated at 180° C. for 30 minutes.

\* \* \* \* \*